United States Patent
United States Patent
Matsumoto

(10) Patent No.: US 11,122,721 B2
(45) Date of Patent: Sep. 14, 2021

(54) COMPONENT SUPPLY SYSTEM

(71) Applicant: FUJI CORPORATION, Chiryu (JP)

(72) Inventor: Toru Matsumoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 230 days.

(21) Appl. No.: 16/331,313

(22) PCT Filed: Sep. 22, 2016

(86) PCT No.: PCT/JP2016/077919
§ 371 (c)(1),
(2) Date: Mar. 7, 2019

(87) PCT Pub. No.: WO2018/055713
PCT Pub. Date: Mar. 29, 2018

(65) Prior Publication Data
US 2019/0357396 A1 Nov. 21, 2019

(51) Int. Cl.
*H05K 13/08* (2006.01)
*B25J 9/16* (2006.01)
(Continued)

(52) U.S. Cl.
CPC ........ *H05K 13/0812* (2018.08); *B25J 9/1697* (2013.01); *H05K 13/028* (2013.01);
(Continued)

(58) Field of Classification Search
CPC ........... H05K 13/0812; H05K 13/0813; H05K 13/028; H05K 13/043;
(Continued)

(56) References Cited

U.S. PATENT DOCUMENTS 9,469,035 B2  10/2016  Noda et al.
2017/0196131 A1  7/2017  Ishikawa
2018/0035581 A1  2/2018  Matsumoto et al.

FOREIGN PATENT DOCUMENTS

JP  WO2013/002099 A1  1/2013
JP  WO2015/186188 A1  12/2015
(Continued)

OTHER PUBLICATIONS

International Search Report dated Dec. 27, 2016 in PCT/JP2016/077919 filed on Sep. 22, 2016.
(Continued)

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

A loose component supply device in which components scattered on stage are imaged by camera. Because the viewing angle of the camera is α>0, a side surface of the component is imaged. Based on the image data of the component, an index value specifying a size of the side surface of the component is calculated. Then, in a case in which the calculated index value matches a set value, it is determined that it is possible to hold the component. In other words, in a case in which there is a certain distance between multiple components, from imaging a side surface of the component, if an index value that specifies the size of the side surface of the component matches the set value, it is determined that it is possible to hold the component.

4 Claims, 20 Drawing Sheets

(51) Int. Cl.
   *H05K 13/02* (2006.01)
   *H05K 13/04* (2006.01)

(52) U.S. Cl.
   CPC ....... *H05K 13/043* (2013.01); *H05K 13/0813* (2018.08); *G05B 2219/37572* (2013.01); *G05B 2219/50* (2013.01)

(58) Field of Classification Search
   CPC ... H05K 13/0404–0413; H05K 13/0408; B25J 9/1697; G05B 2219/37572; G05B 2219/50
   See application file for complete search history.

(56) References Cited

FOREIGN PATENT DOCUMENTS

| | | | |
|---|---|---|---|
| JP | WO2016/129069 A1 | 8/2016 | |
| KR | 20100032542 A * | 3/2010 | ......... H05K 13/0813 |
| WO | WO-2015097904 A1 * | 7/2015 | ........... H05K 13/028 |
| WO | WO 2016/046897 A1 | 3/2016 | |
| WO | WO-2017064786 A1 * | 4/2017 | ....... G01N 21/95684 |

OTHER PUBLICATIONS

Office Action dated Feb. 17, 2021 in corresponding European Patent Application No. 16 916 782.2, 6 pages.

* cited by examiner

COMPONENT SUPPLY SYSTEM

TECHNICAL FIELD

The present application relates to a component supply system configured to supply components in a state scattered on a stage.

BACKGROUND ART

There is a known component supply system that supplies components in a state scattered on a stage. In such a system, it is necessary to determine whether a component can be held by a holding tool based on an orientation of the components scattered on the stage, a distance between components, and the like. In the patent literature below, a method for determining whether it is possible to hold a scattered component is disclosed.

Patent literature 1: International re-publication WO2013/002099

BRIEF SUMMARY

Technical Problem

By using technology disclosed in the above patent literature, it is possible to a certain extent to determine whether it is possible to hold a scattered component. However, it is desirable to even more effectively determine whether it is possible to hold a scattered component. The present disclosure takes account of such circumstances and an object thereof is to appropriately determine whether it is possible to hold a scattered component.

Solution to Problem

To solve the above problems, a component supply system of the present disclosure is configured to supply components on a stage in a scattered state, the component supply system including: a holding tool configured to hold the component scattered on the stage; an imaging device configured to image a target component that is a holding target of the holding tool; and a control device, the control device including a first calculating section configured to calculate an index value that specifies a size of a side surface of the target component based on image data of the target component captured by the imaging device; a first determining section configured to determine whether the index value calculated by the first calculating section matches a set value; and a control section configured to control movement of the holding tool such that the target component is held by the holding tool in a case in which the first determining section determines that the index value matches the set value.

Advantageous Effects

In a component supply system of the present disclosure, an index value that specifies a size of a side surface of a component is calculated based on imaging data of a component captured by an imaging device. Then, in a case in which the calculated index value matches a set value, it is determined that it is possible to hold the component. In other words, in a case in which there is a certain distance between multiple components, from imaging a side surface of the component, if an index value that specifies the size of the side surface of the component matches the set value, it is determined that it is possible to hold the component. Accordingly, it is possible to determine appropriately whether it is possible to hold the component scattered on the stage.

DESCRIPTION OF PREFERRED EMBODIMENTS

The following describes in detail referring to the figures an example embodiment of the present disclosure.

Configuration of Component Mounter

Figure 1:
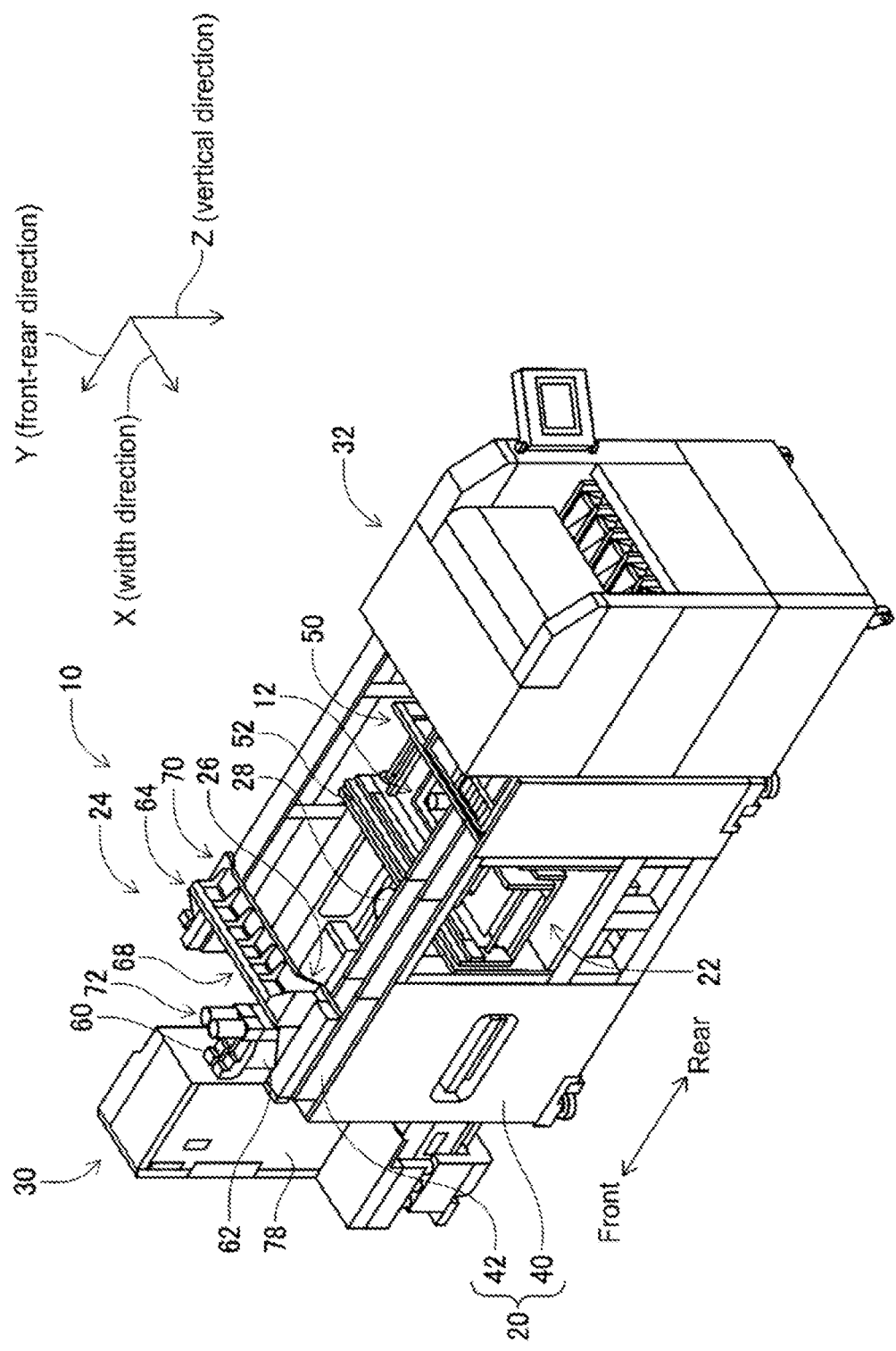
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device 34 (refer to FIG. 12). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40.

Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
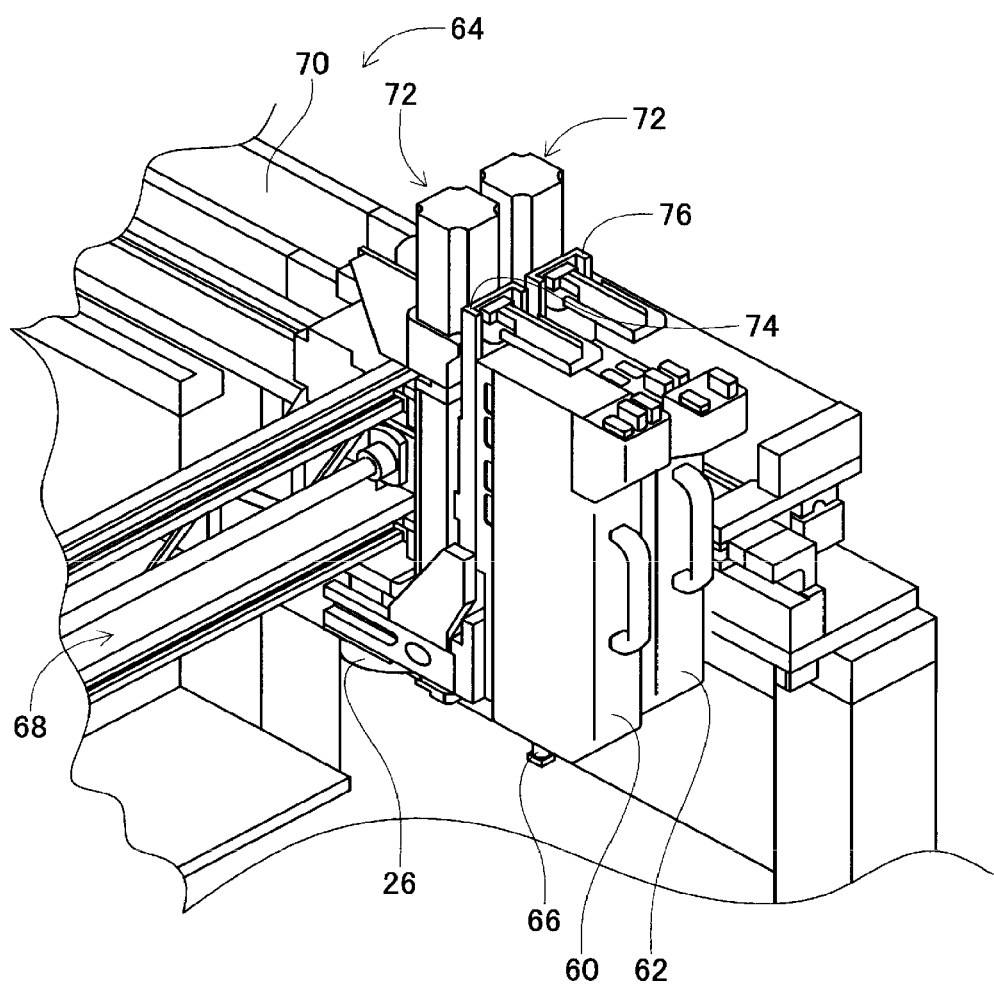
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
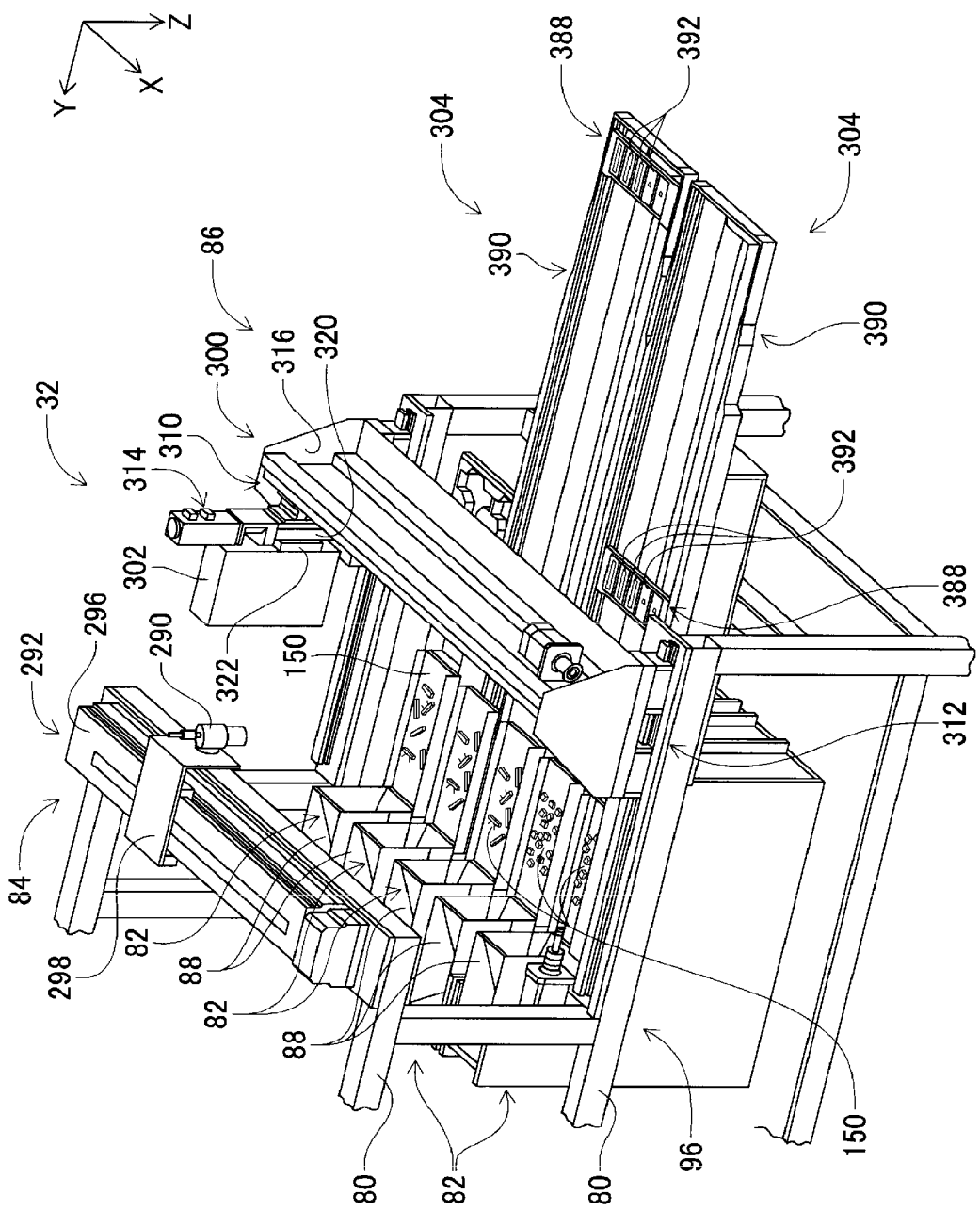
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 5), with component supply apparatus 88, component scattering device 90, and component returning device 92 being integrated into one unit. Component supply unit 82 is assembled to be removable from base 96 of main body 80, and with loose component supply device 32, five component supply units 82 are arranged in one row in the X direction.

(i) Component Supply Apparatus

Figure 4:
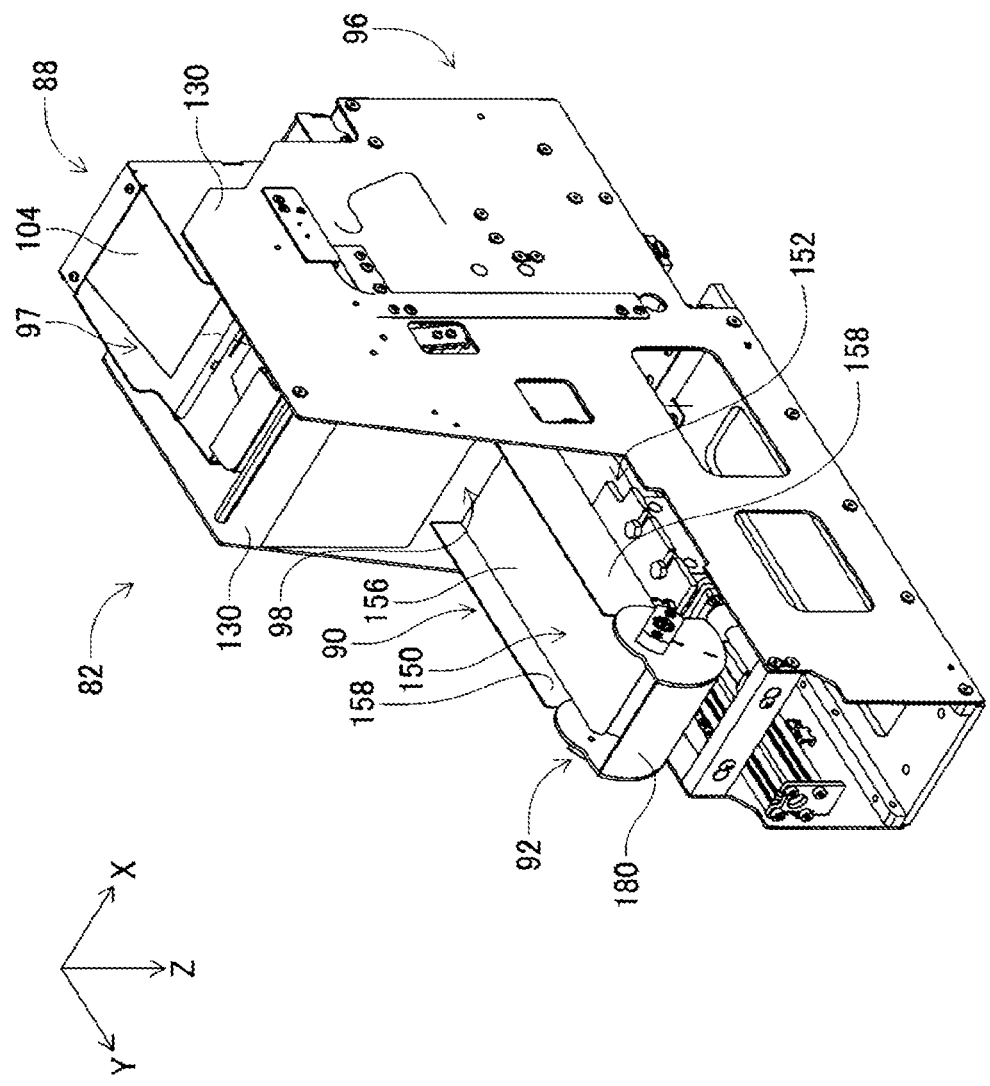
FIG. 4 is a perspective view of a component supply unit.
Figure 5:
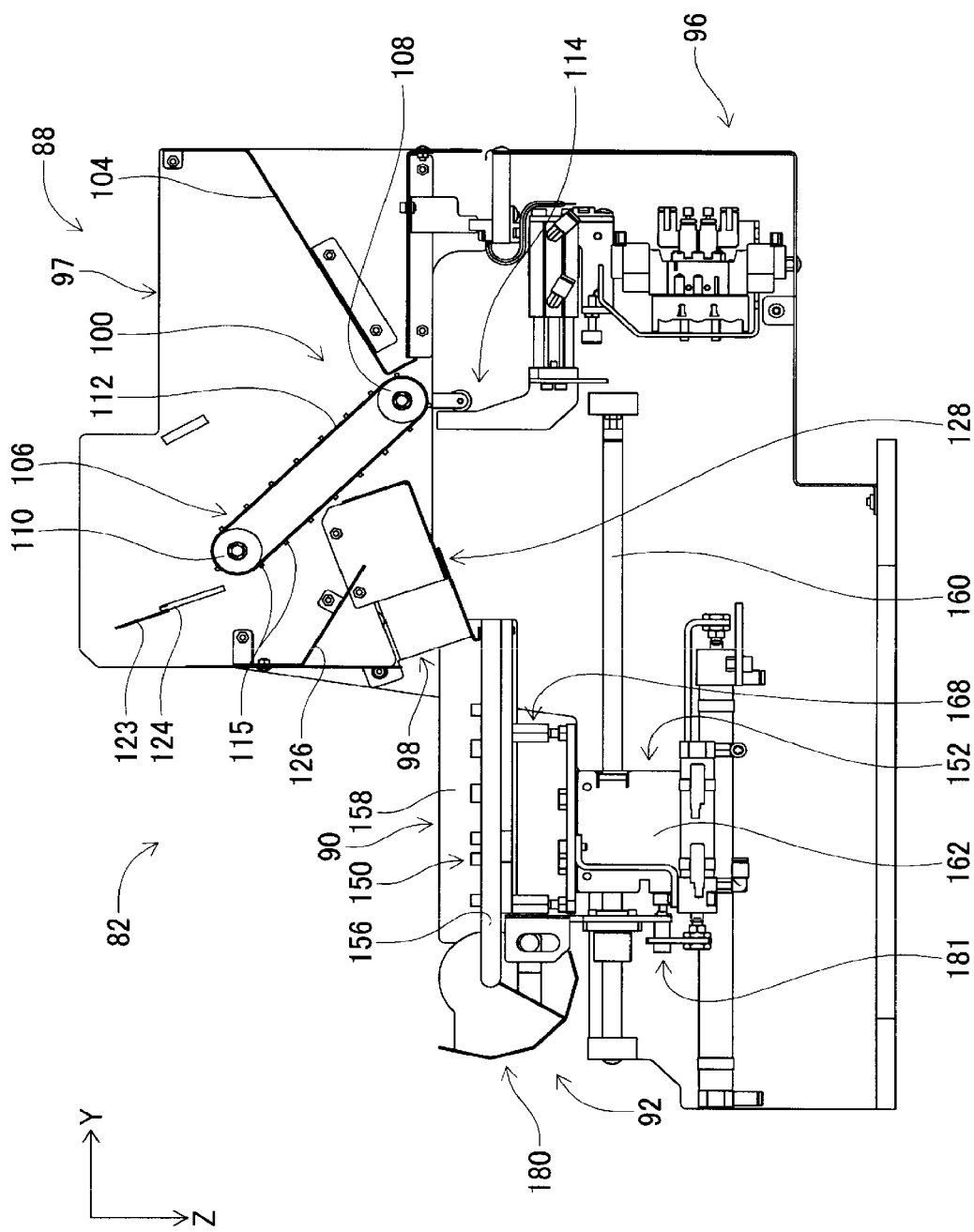
FIG. 5 is a cross section view of the component supply unit.

As shown in FIGS. 4 and 5, component supply apparatus 88 is a substantially cuboid box arranged to extend in the Y direction. The Y direction is the front-rear direction of component supply apparatus 88 with the left side in FIG. 5 sometimes referred to as the front and the right side in FIG. 5 sometimes referred to as the rear. That is, in component supply unit 82, the side towards the end at which component returning device 92 is arranged is sometimes referred to as the front, and the side towards the end at which component supply apparatus 88 is arranged is sometimes referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged across the entire width (X direction) of component supply apparatus 88 and is inclined from the rear end surface of component supply apparatus 88 towards the center such that the front end of inclined plate 104 is positioned lower than the rear end.

Also, as shown in FIG. 5, conveyor device 106 is arranged at the front side of inclined plate 104. Conveyor device 106 includes a pair of rollers 108 and 110, and conveyor belt 112. Each of the rollers 108 and 110 are arranged inside component supply apparatus 88 extending in the width direction of component supply apparatus 88 across the entire width of component supply apparatus 88. Further, roller 108 faces the front end of inclined plate 104, that is, the lowest end of inclined plate 104, with a clearance gap between them. Note that, the clearance between the front end of inclined plate 104 and roller 108 is smaller than components that are supplied by component supply apparatus 88. Also, roller 110 is arranged diagonally above and to the front of roller 108. Conveyor belt 112 is stretched over the pair of rollers 108 and 110. Note that, conveyor belt 112 has a width slightly less than the internal width dimension of component supply apparatus 88.

Also, the pair of rollers 108 and 110 are rotatable around their center axis, with rotation being controlled by operation of rotation device 114. The rotation direction of rollers 108 and 110 is the counterclockwise direction in FIG. 5. Thus, conveyor belt 112 revolves around rollers 108 and 110 in a counterclockwise direction in FIG. 5. In other words, the conveyance direction of conveyor belt 112 is diagonally up from the front end of inclined plate 104. Multiple protrusions 115 are formed in the upper surface, that is, the conveyance surface, of conveyor belt 112 extending across the width of conveyor belt 112. The multiple protrusions 115 are formed at specified intervals in the revolving direction of conveyor belt 112 with the intervals being longer than the length direction of components supplied by component supply apparatus 88.

Also, brush holding section 123 is arranged diagonally above and in front of roller 110 of conveyor device 106. Brush holding section 123 is arranged extending in the width direction of component supply apparatus 88 across the entire width of component supply apparatus 88. Brush 124 is attached to the lower end of brush holding section 123 extending towards roller 110 of conveyor device 106. The width dimension of brush 124 is slightly smaller than the internal width dimension of component supply apparatus 88 and faces conveyor belt 112 wound around roller 110 across the entire width direction of component supply apparatus 88 with a clearance gap between brush 124 and conveyor belt 112. The clearance between the tip of brush 124 and conveyor belt 112 wound around roller 110 is longer than the thickness dimension of components supplied by component supply apparatus 88 and less than two times the thickness dimension of components supplied by component supply apparatus 88.

Also, inclined plate 126 is arranged diagonally below and in front of roller 110 of conveyor device 106. Inclined plate 126 is arranged across the entire width of component supply apparatus 88 and is inclined from the front end surface of component supply apparatus 88 to below roller 110 such that the rear end of inclined plate 126 is positioned lower than the front end. Further, inclined plate 128 is arranged below inclined plate 126. Inclined plate 128 is arranged across the entire width of component supply apparatus 88 and is inclined from below a central portion of conveyor device 106 towards discharge opening 98 of component supply apparatus 88 such that the front end of inclined plate 128 is positioned lower than the rear end. The rear end of inclined plate 128 is positioned further to the rear than the rear end of inclined plate 126, and the rear end of inclined plate 128 is bent upward at a right angle. The front end of inclined plate 128 is bent to the rear to be substantially horizontal.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130.

(ii) Component Scattering Device

Component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the bent front end of inclined plate 128 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Further, as shown in FIG. 5, component support section moving device 152 includes guide rail 160 and slider 162. Guide rail 160 extends in the lengthwise direction of stage 156 below component support member 150. Slider 162 is slidably attached to guide rail 160 so as to be slid to any position by operation of electromagnetic motor 166 (refer to FIG. 12). Stage 156 of component support member 150 is connected to slider 162 via connection mechanism 168. Thus, component support member 150 moves in the Y direction by operation of component support member moving device 152, so as to move to and from a stored state (refer to FIG. 6) stored below component supply apparatus 88 and an exposed state (refer to FIG. 5) drawn out from below component supply apparatus 88.

(iii) Component Returning Device

Figure 7:
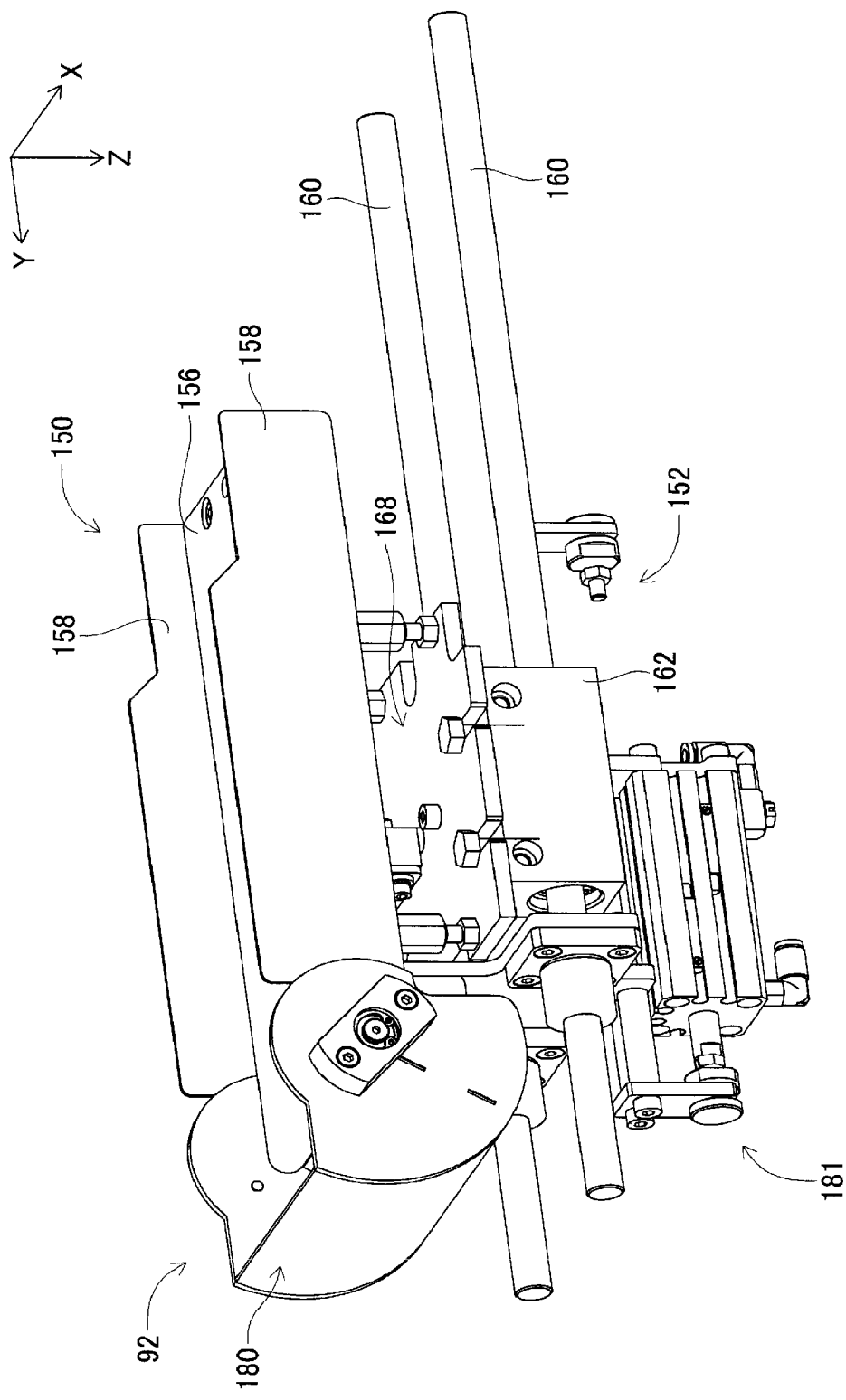
FIG. 7 is a perspective view of a component scattering device.
Figure 8:
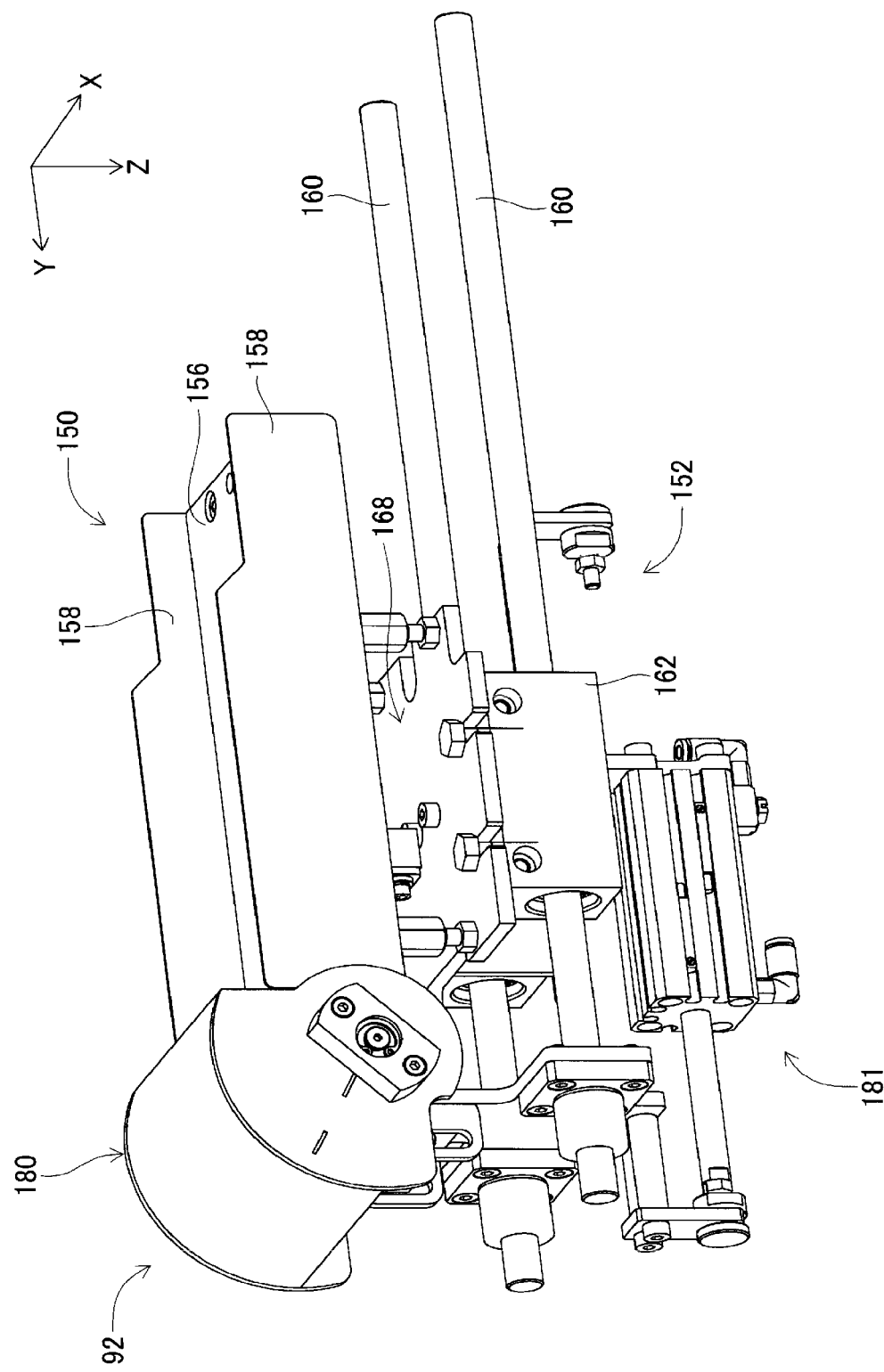
FIG. 8 is a perspective view of a component scattering device.

As shown in FIG. 7, component returning device 92 includes component collection container 180 and container oscillating device 181. Component collection container 180 is a box with an arc-shaped bottom surface. Component collection container 180 is held to be swingable around the front end of stage 156 of component holding member 150 and is swung by operation of container oscillating device 181. Here, component collection container 180 is swung between a collection orientation (refer to FIG. 7) with the opening facing up, and a return orientation (refer to FIG. 8) with the opening facing the upper surface of stage 156 of component support member 150.

(b) Imaging Device

As shown in FIG. 3, imaging device 84 includes camera 290 and camera moving device 292. Camera moving device 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 12). Also, camera 290 is attached to slider 298 facing downwards.

(c) Component Transfer Device As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 and extending in the X direction, and Y slider 316 is moved to any position in the Y direction by operation of electromagnetic motor 319 (refer to FIG. 12). X-direction moving device 310 includes X slider 320 provided on a side surface of Y slider 316, and X slider 320 is moved to any position in the X direction by operation of electromagnetic motor 321 (refer to FIG. 12). Z-direction moving device 314 includes Z slider 322 provided on a side surface of X slider 320, and Z slider 322 is moved to any position in the Z direction by operation of electromagnetic motor 323 (refer to FIG. 12).

Figure 9:
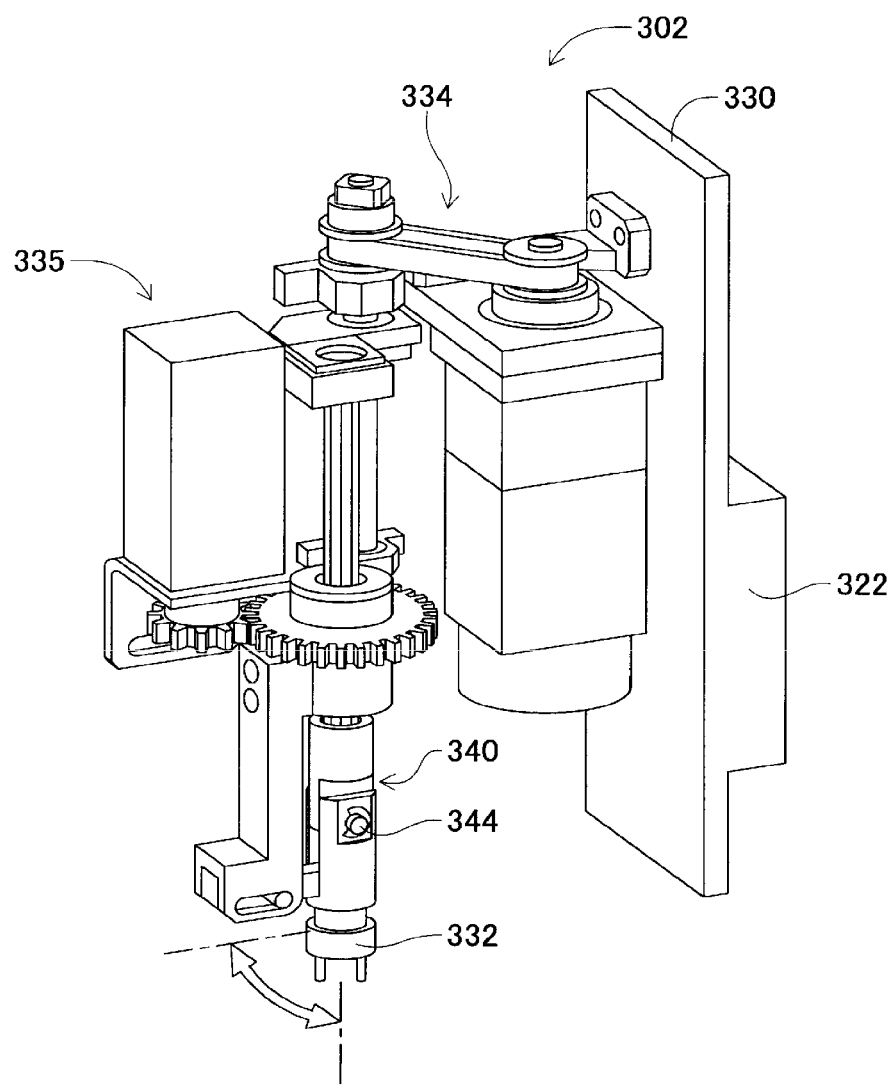
FIG. 9 is a perspective view of a component holding head.
Figure 10:
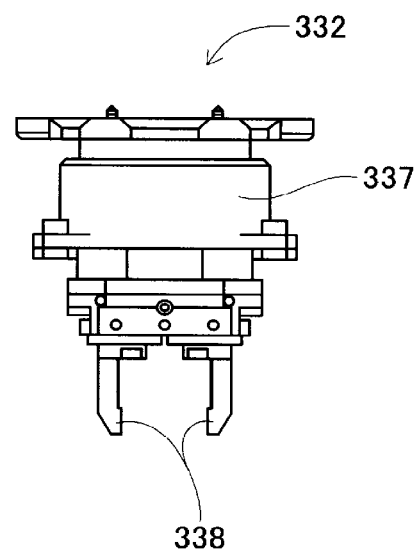
FIG. 10 shows a chuck.

As shown in FIG. 9, component holding head 302 includes head main body 330, chuck 332, pivoting device 334, and rotating device 335. Head main body 330 is formed as one body with Z slider 322. As shown in FIG. 10, chuck 332 includes main body section 337 and pair of claw sections 338. The pair of claw sections 338 are provided extending down from the bottom surface of main body section 337, and are able to slide towards and away from each other. Thus, chuck 332 sandwiches a component between the pair of claw sections 338 by the pair of claw sections 338 being moved towards each other, and releases the component from the pair of claw sections 338 by the pair of claw sections 338 being moved away from each other. As shown in FIG. 9, chuck 332 is removably attached to the bottom end of holder 340.

Holder 340 is able to bend at support shaft 344, and holder 340 bends 90 degrees in an up direction by operation of pivoting device 334. By this, chuck 332 attached to the bottom end of holder 340 is pivoted 90 degrees to be positioned at the pivoted position. That is, chuck 332 is able to be pivoted to and from a non-pivoted position and a pivoted position by operation of pivoting device 334. Also, rotating device 335 rotates chuck 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 11:
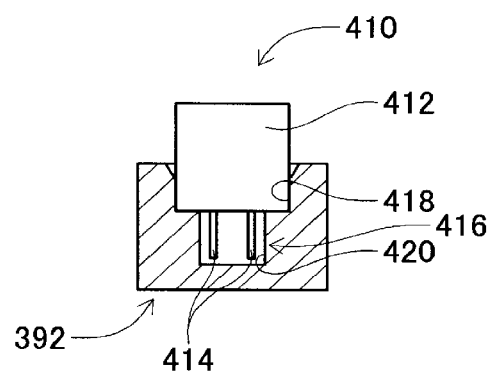
FIG. 11 shows a component receiving member in which a leaded component is stored.

In detail, as shown in FIG. 11, components supplied by loose component supply device 32 are electronic circuit components 410 that have leads (hereinafter also referred to as "leaded components"), with leaded components 410 being configured from a cuboid component main body 412, and two leads 414 that protrude from the bottom surface of component main body 412. Also, component reception recess 416 is formed in component receiving member 392. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 12). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 12:
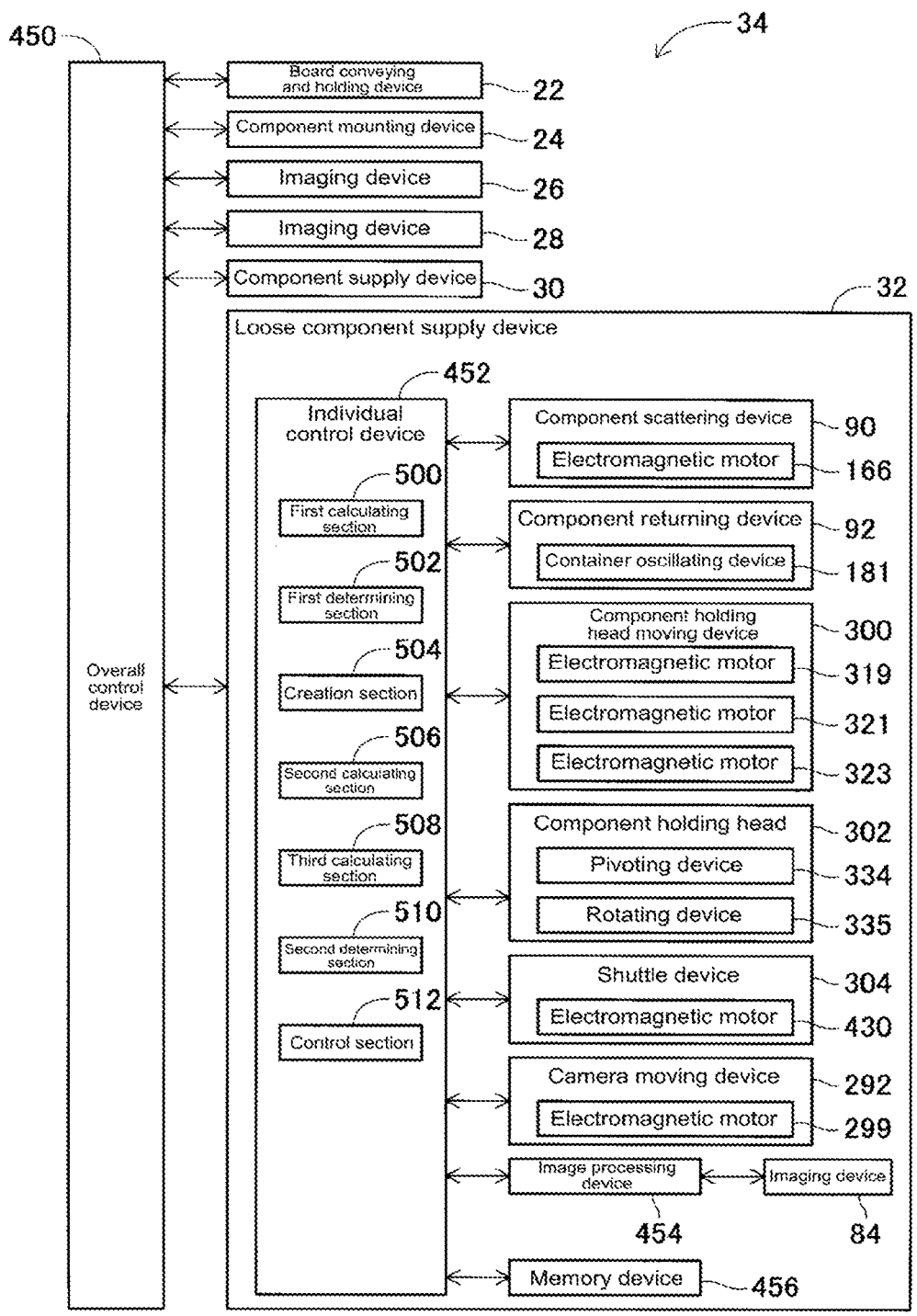
FIG. 12 is a block diagram showing a control device of the component mounter.

Further, as shown in FIG. 12, control device 34 includes overall control device 450, multiple individual control devices (only one is shown in the FIG. 452, image processing device 454, and memory device 456. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84. Also, memory device 456 memorizes various types of data and is connected to individual control device 452. By this, individual control device 452 acquires various types of data from memory device 456.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Loose Component Supply Device Operation (a) Supply of Leaded Components Using Loose Component Supply Device With loose component supply device 32, leaded components 410 are inserted by an operator into insertion opening 97 of component supply apparatus 88, then the inserted leaded components 410 are supplied in a state loaded on component receiving member 392 of component carrier 388 by operation of component supply unit 82 and component transfer device 86. In detail, the operator inserts leaded components 410 via insertion opening 97 at the top of component supply apparatus 88. Here, component supporting member 150 is moved below component supply apparatus 88 by operation of component support member moving device 152 to be in a stored state (refer to FIG. 6). With component support member 150 in a stored state, component collection container 180 positioned at the front end of component support member 150 is positioned in front of component supply apparatus 88, and the opening of component collection container 180 is oriented facing up (collection orientation, refer to FIG. 7).

Figure 6:
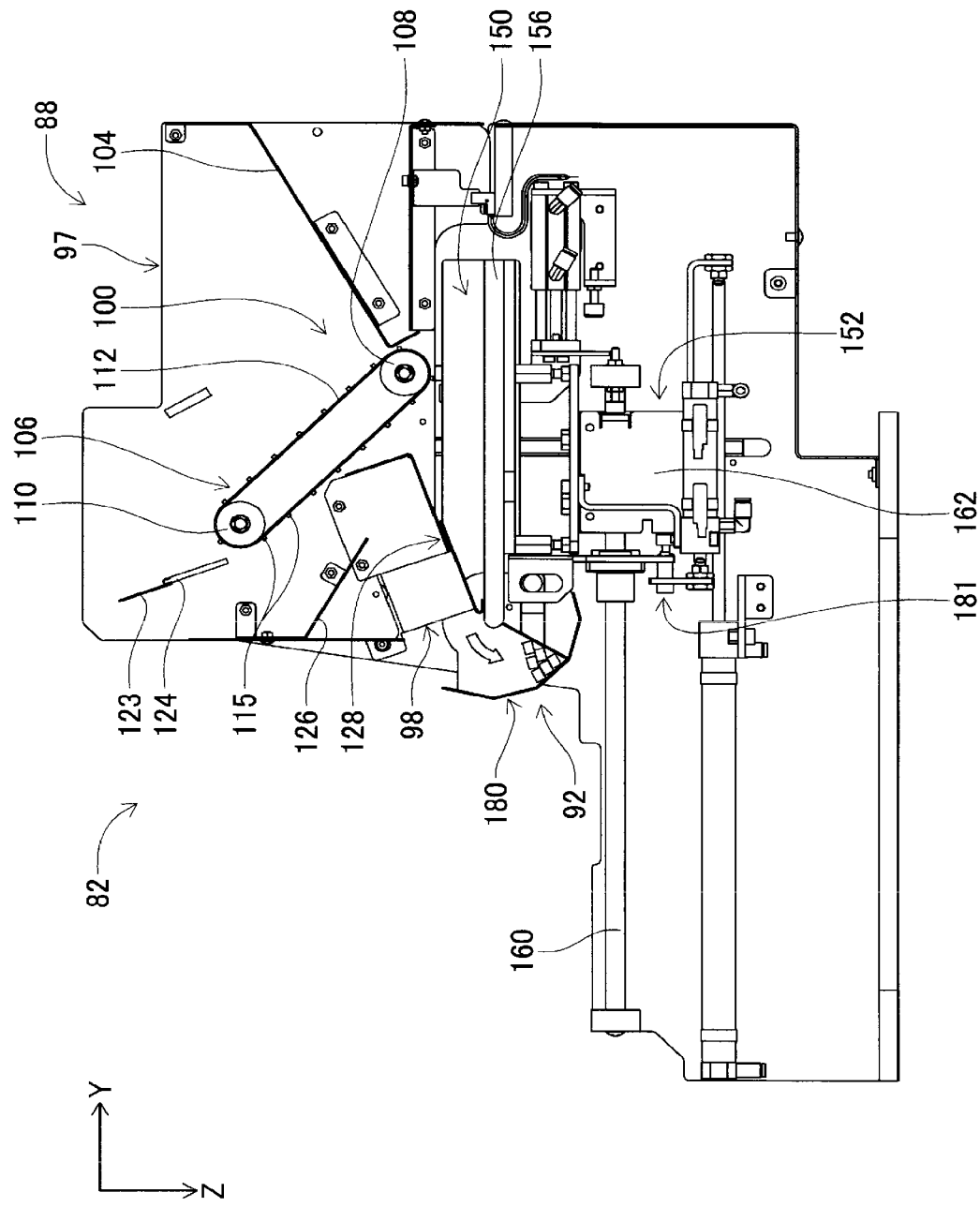
FIG. 6 is a cross section view of the component supply unit.

Leaded components 410 inserted via insertion opening 97 on the top surface of component supply apparatus 88 fall onto inclined plate 104 of component supply apparatus 88 and roll down to the front lower end of inclined plate 104. Here, leaded components 410 that have rolled down to the front bottom end of inclined plate 104 pile up between the front bottom end of inclined plate 104 and the rear bottom end of conveyor device 106. In other words, between the lower front end of inclined plate 104 and the lower rear end of conveyor device 106 functions as housing section 100 for housing leaded components 410. Then, when rotation device 116 of conveyor device 106 is operated, conveyor belt 112 of conveyor device 106 is rotated counterclockwise as shown in FIG. 6. By this, leaded components 410 piled up in housing section 100 are conveyed by conveyor belt 112 diagonally up and forward.

Then, leaded components 410 conveyed diagonally up by conveyor belt 112 pass between the upper end on the front side of conveyance device 106 and brush 124 and fall onto inclined plate 120 provided below the upper end on the front side of conveyance device 106 and brush 124. Leaded components 410 that have fallen onto inclined plate 126 roll towards the rear of inclined plate 126 onto inclined plate 128 provided below inclined plate 126. Then, leaded components 410 that have fallen onto inclined plate 128 roll towards the front and are discharged from discharge opening 98 at the front of component supply apparatus 88. In this manner, leaded components 410 that have fallen from the front end of conveyor device 106 fall onto inclined plate 126 and then onto inclined plate 128. That is, leaded components 410 are discharged from discharge opening 98 of component supply apparatus 88. By this, damage to leaded components 410 due to falling is reduced.

Component support member 150 is moved towards the front from under component supply apparatus 88 due to operation of component supply member moving device 152 at the time that leaded components 410 are discharged from discharge opening 98 of component supply apparatus 88. By this, leaded components 410 discharged from discharge opening 98 of component supply apparatus 88 are discharged onto the upper surface of stage 156 of component support member 150.

Leaded components 410 that have been discharged onto stage 156 from component supply apparatus 88 roll forward, though even if they roll and fall from the front of stage 156 they are stored in component collection container 180. Also, if leaded components 410 that have been discharged onto stage 156 from component supply apparatus 88 roll sideways, they are prevented from falling from stage 156 by side walls 158 of component support member 150.

Then, component support member 150 is moved forwards from the stored state to the exposed state and then movement of component support member 150 is stopped. By this, leaded components 410 are scattered across the entire upper surface of stage 156. With component supply apparatus 88, operation of conveyor device 106 is stopped to match the timing of the stopping of the operation of component support member 150 such that leaded components 410 are discharged finally from component supply apparatus 88.

Figure 13:
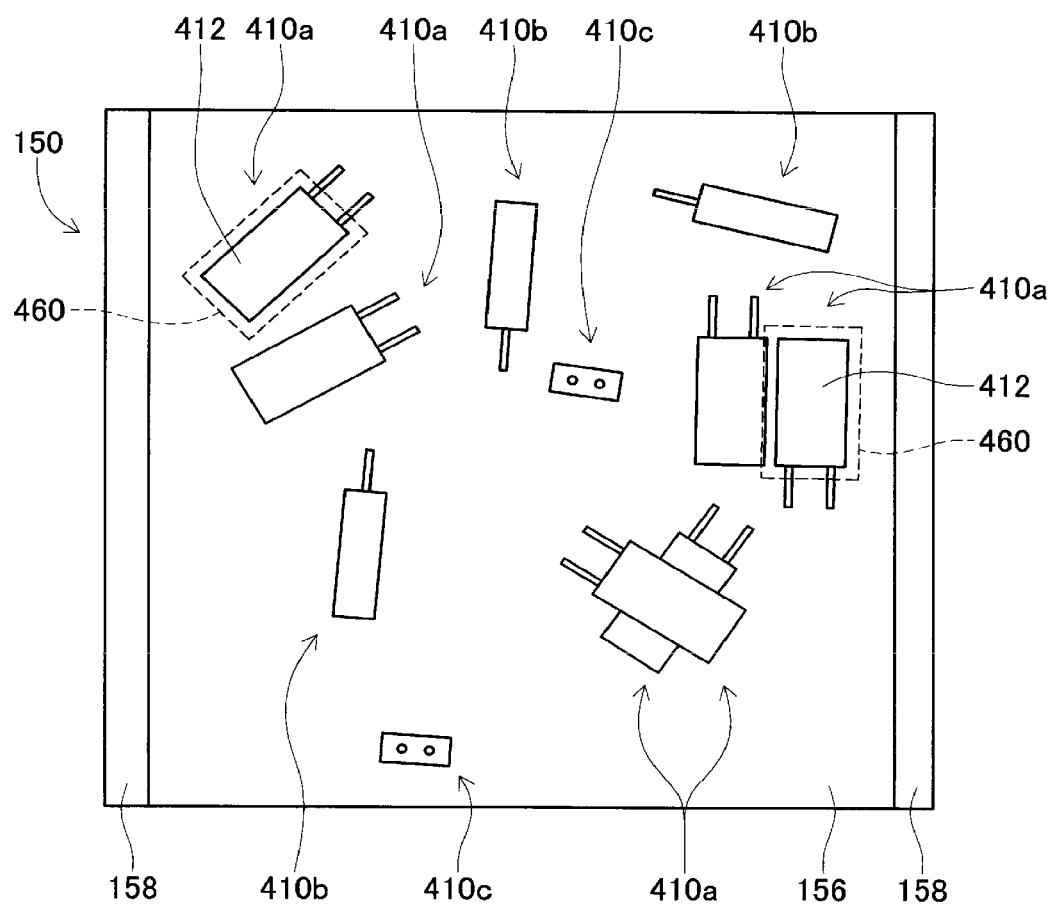
FIG. 13 shows leaded components scattered on a stage.

Note that, when leaded components 410 are scattered on stage 156 of component support member 150 from component storage apparatus 88, as shown in FIG. 13, leaded components 410 are scattered on stage 156 in largely three orientations. Specifically, leaded components 410 are scattered on stage 156 in the following three orientations: an orientation in which the two leads 414 are in a state approximately lined up in a horizontal direction (also referred to as a "first orientation"); an orientation in which the surface from which the leads 414 extend faces sideways and the two leads 414 are in a state approximately lined up in a vertical direction (also referred to as a "second orientation"); and an orientation in which the surface from which the leads 414 extend faces upwards (also referred to as a "third orientation"). Note that, when distinguishing between orientations of scattered leaded components 410, components are given as leaded component 410a in a first orientation, leaded component 410b in a second orientation, and leaded component 410c in a third orientation.

When leaded components 410 are scattered on stage 156 as above, camera 290 of imaging device 84, by operation of camera moving device 292, moves above component support member 150 and images leaded components 410. Then, based on the image data imaged by camera 290, a leaded component that is a target for pickup (also referred to as "pickup target component") is identified by pattern matching.

Figure 14:
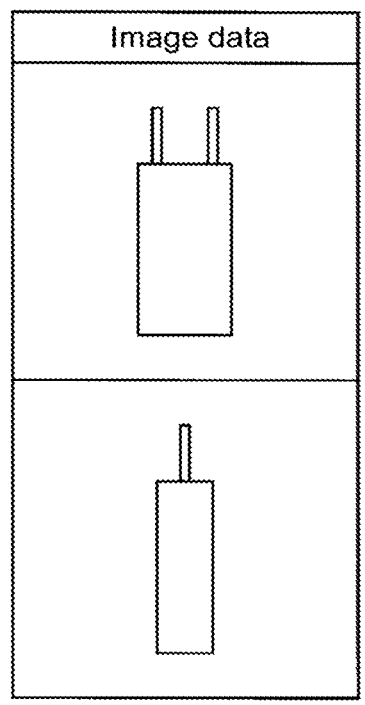
FIG. 14 shows a leaded component to be recognized by pattern matching.

Specifically, based on the image data of leaded component 410 captured by camera 290, outer edge lines (outline) of leaded component 410 are identified, and the shape of the upper surface of leaded component 410, that is, the shape of leaded component 410 as seen from above, is calculated. Further, based on the image data, the position of leaded component 410 is calculated. On the other hand, as shown in FIG. 14, memory device 456 memorizes image data of the shape according to the outer edge lines of lead component 410a in the first orientation (hereinafter also sometimes referred to as "first orientation component image data"), and image data of the shape according to the outer edge lines of lead component 410b in the second orientation (hereinafter also sometimes referred to as "second orientation component image data")

Then, it is determined whether the shape of the upper surface of leaded component 410 calculated based on the image data (hereinafter also sometimes referred to as "image component shape") matches the shape of leaded component 410 based on the first orientation component image data (hereinafter also sometimes referred to as "first memorized component shape") or the shape of leaded component 410 based on the second orientation component image data (hereinafter also sometimes referred to as "second memorized component shape"). Next, if the image component shape matches the first memorized component shape or the second memorized component shape, the leaded component according to that image component shape is set as a pickup target component. That is, leaded component 410a in the first orientation and leaded component 410b in the second orientation are set as a pickup target component, and leaded component 410c in the third orientation is not set as a pickup target component. This is because, with leaded component 410c in the third orientation, leads 414 are arranged on the upper surface, meaning that the leaded component 410 cannot be appropriately held by chuck 332 due to the leads 414 getting in the way.

However, there are cases in which leaded component 410a in the first orientation and leaded component 410b in the second orientation also cannot be appropriately held by chuck 332. Specifically, descriptions are given when leaded components 13 are scattered as shown in FIG. 13. The distance between the two leaded components 410 in the first orientation positioned at the top left in FIG. 13 is relatively large. Therefore, when one of those two leaded components 410a is picked up by chuck 332, it can be supposed that the chuck 332 will not interfere with the other leaded component 410a, such that appropriate pickup can be guaranteed. On the other hand, the distance between the two leaded components 410 in the first orientation positioned at the right in FIG. 13 is relatively small. Therefore, when one of those two leaded components 410a is picked up by chuck 332, there is a concern that the chuck 332 will interfere with the other leaded component 410a, such that appropriate pickup cannot be guaranteed.

Thus, with a conventional method, holding-not-possible range 460 is set at a location separated by a set distance from the outer edge lines of component main body 412 of leaded component 410 set as the pickup target component. Also, it is determined whether there is another leaded component 410 or the like in the holding-not-possible range 460 of the leaded component 410 set as the pickup target, and if it is determined that there is another leaded component or the like in the holding-not-possible range 460, the setting of that component as the pickup target component is canceled. On the other hand, if it is determined that there is no other leaded component 410 or the like in the holding-not-possible range 460, the setting of that component as the pickup target component is left unchanged. Thus, there is no danger of chuck 332 interfering with other items during pickup, and pickup can be performed appropriately.

Figure 15:
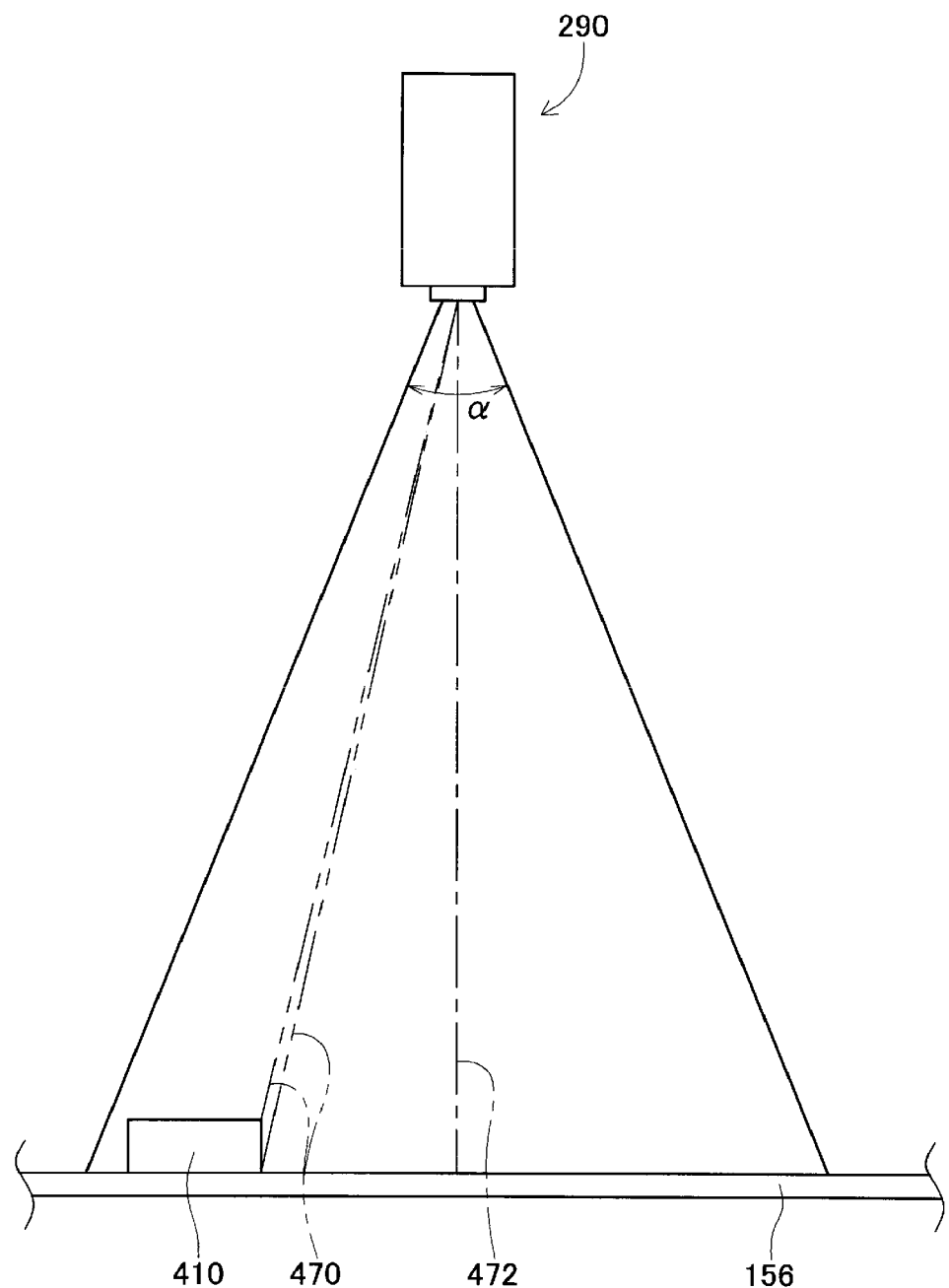
FIG. 15 shows a state of imaging of a leaded component captured by a camera with a viewing angle greater than 0 degrees.

However, because camera 290 that images leaded components 410 does not have a viewing angle (image angle) of 0 degrees, when capturing an image, a side surface of leaded component 410 is captured, and due to the side surface there are cases in which it is not possible to appropriately determine whether there is another item in the holding-not-possible range 460. Specifically, as shown in FIG. 15, with camera 290, the viewing angle is not 0, it is α>0, such that main light beam 470 entering camera 290 during imaging is not parallel to the light axis 472 of camera 290. Note that, main light beam 470 is a light beam that passes through the focal center of a lens of camera 290 during imaging. Therefore, as shown, when imaging leaded component 410, the light beam reflected by the side surface of leaded component 410 enters camera 290 and the side surface of the leaded component 410 is imaged. Note that, with a camera that uses a telecentric lens or the like, the viewing angle is 0, so the main light beam and the light axis are parallel, meaning that the side surface of leaded component 410 is not captured during imaging of leaded component 410.

Figure 16:
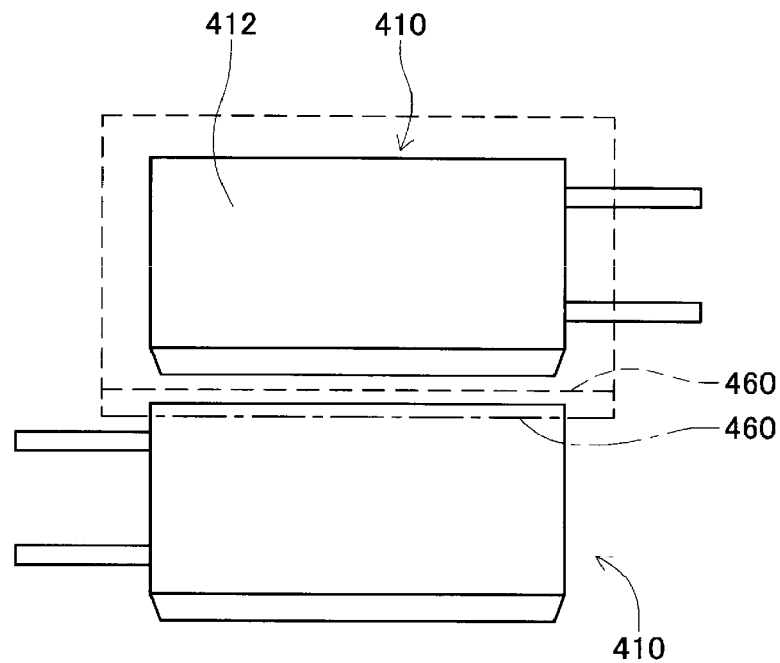
FIG. 16 is a conceptual view showing two adjacent leaded components.

As described above, when the side surface of leaded component 410 is captured, an image based on that image data looks as shown in FIG. 16. In this image, when the holding-not-possible range 460 is given based on the upper surface of component main body 412 of leaded component 410, the holding-not-possible range 460 is as shown by the dashed line. Because there is no other leaded component 410 in the holding-not-possible range 460 shown by the dashed line, this leaded component 410 can be set as the pickup target component. In other words, because component main body 412 is cuboid, in a case in which there is no other leaded component 410 within the holding-not-possible range 460 based on the upper surface of component main body 412, when that component main body 412 is held by a chuck, there will be no interference with another leaded component 410.

However, as described above, holding-not-possible range 460 is set at a location separated by a set distance from the outer edge lines of component main body 412. Therefore, the holding-not-possible used for determining a pickup target component is set not based on the upper surface of component main body 412, but based on the outer edge lines of component main body 412. The outer edge lines of component main body 412 are not just the upper surface of component main body 412, but include a side surface, thus, when setting holding-not-possible range 460 based on the outer edge lines of component main body 412, holding-not-possible range 460 becomes the single-dashed broken line. Here, there is another leaded component within the holding-not-possible range 460 shown by the single-dashed broken line. Thus, leaded component 410 determined based on holding-not-possible range 460 set based on the outer edge lines of component main body 412 has its setting as the pickup target component canceled. In other words, even though it is actually possible to pick up the component, the component is not set as a pickup target component and remains on stage 156. In this manner, components that could be picked up remain on stage 156, thus worsening the efficiency of component pickup.

Figure 17:
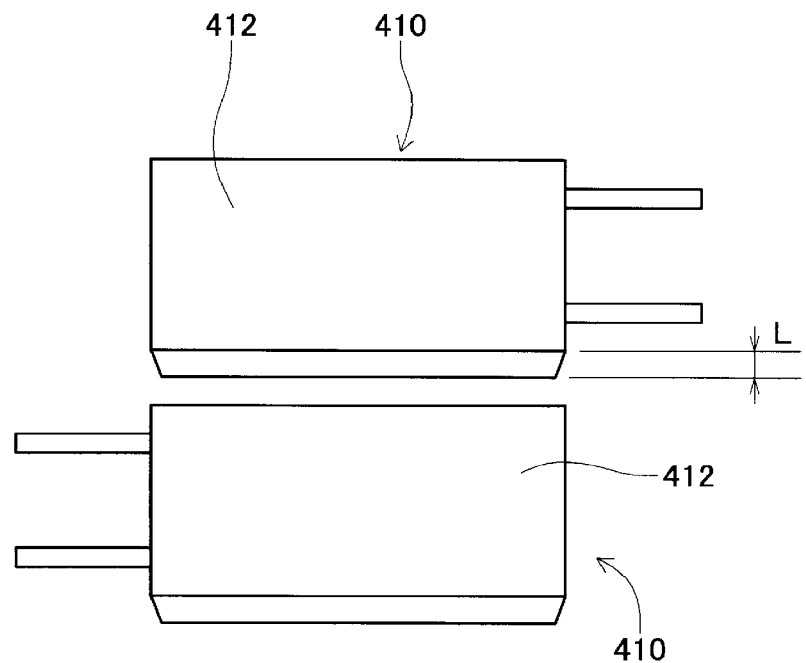
FIG. 17 is a conceptual view showing two adjacent leaded components.

Considering this, with loose component supply device 32, determination regarding pickup target components is performed using a side surface that displays in the captured image when imaging leaded component 410. In detail, based on image data of leaded component 410, the length in the vertical direction of the side surface of the determination target component is calculated. This length L in the vertical direction of the side surface that is calculated (hereinafter sometimes also referred to as "calculated side surface length"), as shown in FIG. 17, is the length between the top edge and the bottom edge of the side surface of leaded component 410. Then, it is determined whether the calculated side surface length L matches an estimated side surface length. Note that, as described in detail later, the estimated side surface length is the estimated length of the side surface in the vertical direction that would be captured in the image in a case in which the side surface of leaded component 410 is not blocked by another item.

Therefore, in a case in which the calculated side surface length L and the estimated side surface length match, as shown in FIG. 17, the side surface of the leaded component 410 that is the target for determination is not blocked by another leaded component 410 due to a relatively large gap existing between the determination target leaded component 410 and the other leaded component 410. In other words, for a leaded component 410 for which the calculated side surface length L matches the estimated side surface length, no interference will occur with another member during pickup and the component can be picked up appropriately. Here, the setting of the leaded component 410 for which the calculated side surface length L matches the estimated side surface length remains as the pickup target component.

Figure 18:
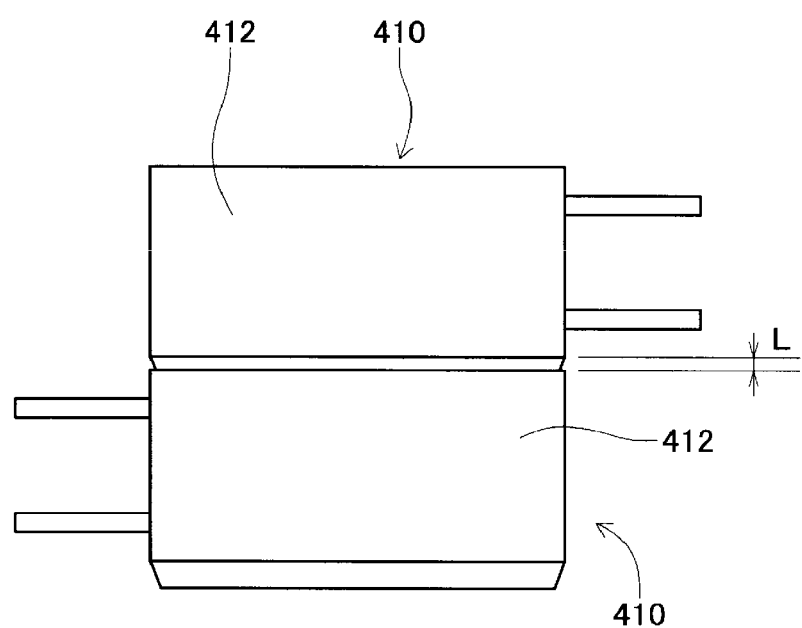
FIG. 18 is a conceptual view showing two adjacent leaded components.

On the other hand, as shown in FIG. 18, in a case in which the gap between the determination target leaded component 410 and another leaded component 410 is extremely narrow, the side surface of the determination target leaded component 410 is blocked by the other leaded component 410, the calculated side surface length L becomes shorter, and the calculated side surface length L does not match the estimated side surface length. Therefore, for a leaded component 410 for which the calculated side surface length L does not match the estimated side surface length, interference may occur with another member during pickup and the component cannot guaranteed to be picked up appropriately. Here, the setting of the leaded component 410 for which the calculated side surface length L does not match the estimated side surface length as the pickup target component is canceled.

In this manner, by performing determination of a pickup target component using the side surface that displays in the captured image when imaging leaded component 410, it is possible to appropriately set components that can be picked up as pickup target components. In detail, the arrangement of leaded components 410 shown in FIG. 16 and the arrangement of leaded components 410 shown in FIG. 17 are the same. With a conventional method (using the holding-not-possible range 460), the leaded component 410 in the state shown in FIG. 16 is not set as the pickup target component, but with the method of the present disclosure (method using the side surface that displays in the image), the leaded component 410 in the state shown in FIG. 17 is set as the pickup target component. Accordingly, it is possible to appropriately set pickup target components, the quantity of components remaining on stage 156 that cannot be picked up is reduced, thus improving efficiency of component pickup.

Also, by performing determination of pickup target components using the side surface that displays in the captured image when imaging leaded component 410, even in a case in which leaded components 410 scattered on stage 156 overlap, it is possible to appropriately determine pickup target components. In detail, the bottom right of FIG. 13 shows scattered leaded components 410 in an overlapping state. In this manner, with leaded components 410 in an overlapping state, because the leaded component 410 that is on top of another leaded component 410 may be positioned above the planned pickup position, it may not be possible to perform pickup appropriately. Thus, such a leaded component 410 should not be set as a pickup target component.

However, in a determination performed using pattern matching, with an image obtained by imaging leaded component 410, because the leaded component 410 is positioned slightly above the planned pickup position, the outer edge lines of the leaded component 410 are slightly smaller, while the shape of the outer edge lines are substantially the same, meaning that the component may be set as a pickup target component. On the other hand, with an image obtained by imaging leaded component 410, due to the influence of the parallax that arises due to the deviation in the main light beam and the light axis of camera 290, the size of the side surface differs greatly in accordance with the height of the imaged leaded component 410.

Figure 19:
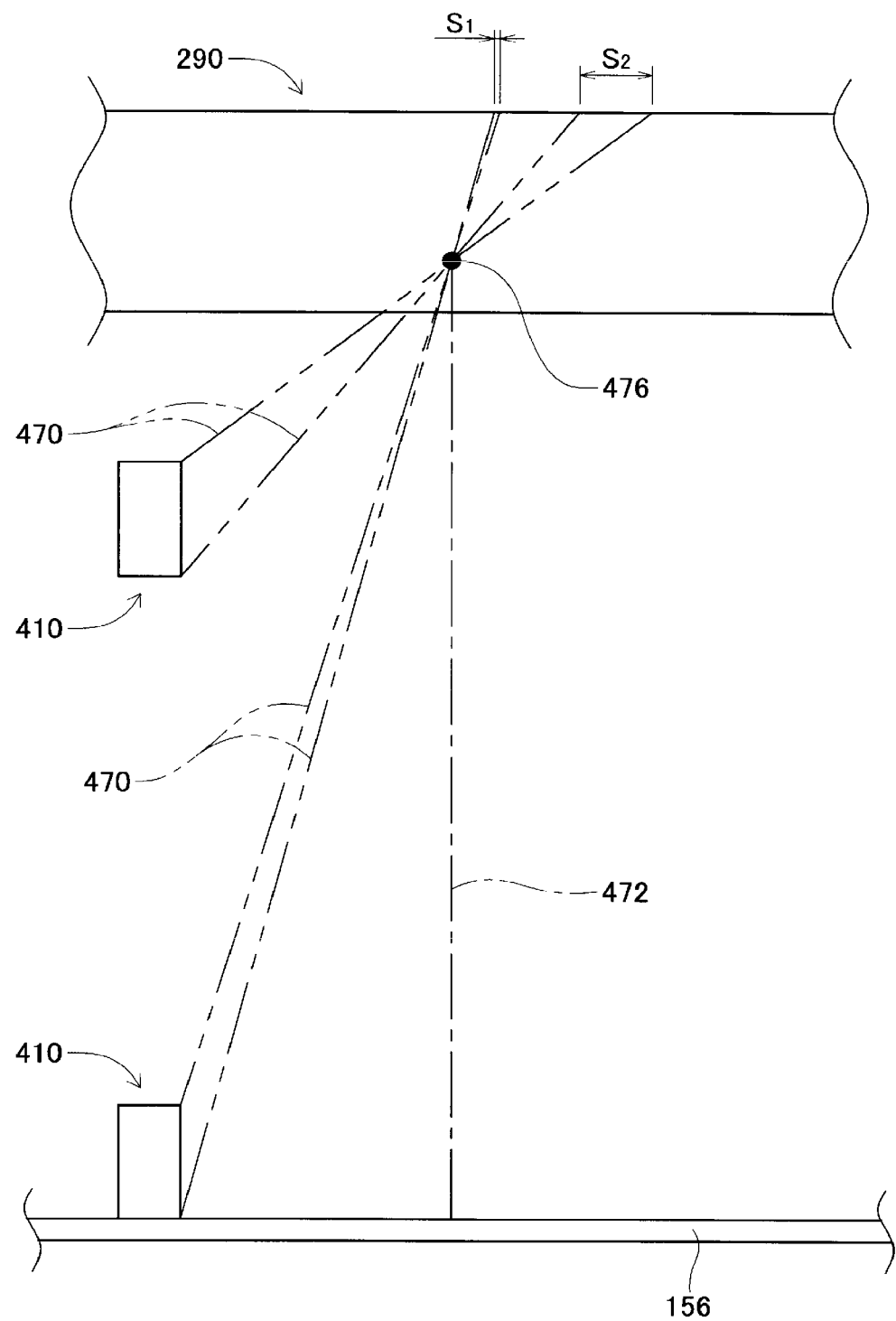
FIG. 19 shows a state of imaging of a leaded component captured by a camera with a viewing angle greater than 0 degrees.

Specifically, as shown in FIG. 19, with camera 290, there is a deviation between main light beam 470 that passes through focal point 476 and light axis 472 of camera 290. With an image formed by reflection from the side surface of leaded component 410 of main light beam 470 that enters camera 290, the higher the position of leaded component 410, the larger the image of the side surface of the leaded component 410. In the figure, the image dimension of the side surface of the leaded component 410 positioned higher (S2) is larger than the image dimension of the side surface of the leaded component 410 positioned lower (S1). This is because the higher the imaging position, the larger the angle between main light beam 470 and light axis 472. In this manner, the higher the imaging position is moved, the larger the image dimension of the side surface of the leaded component 410 becomes, in which case, the length of the side surface of the leaded component 410 calculated based on the image data of the leaded component 410, that is, the calculated side surface length L, becomes longer. Therefore, in a case in which the leaded component 410 is positioned higher than the planned pickup position, calculated side surface length L and the estimated side surface length are different. In other words, by canceling the set of the component as a pickup target component when the calculated side surface length L and the estimated side surface length are different, it is possible to exempt leaded components 410 in an overlapping state from being set as a pickup target component.

Figure 20:
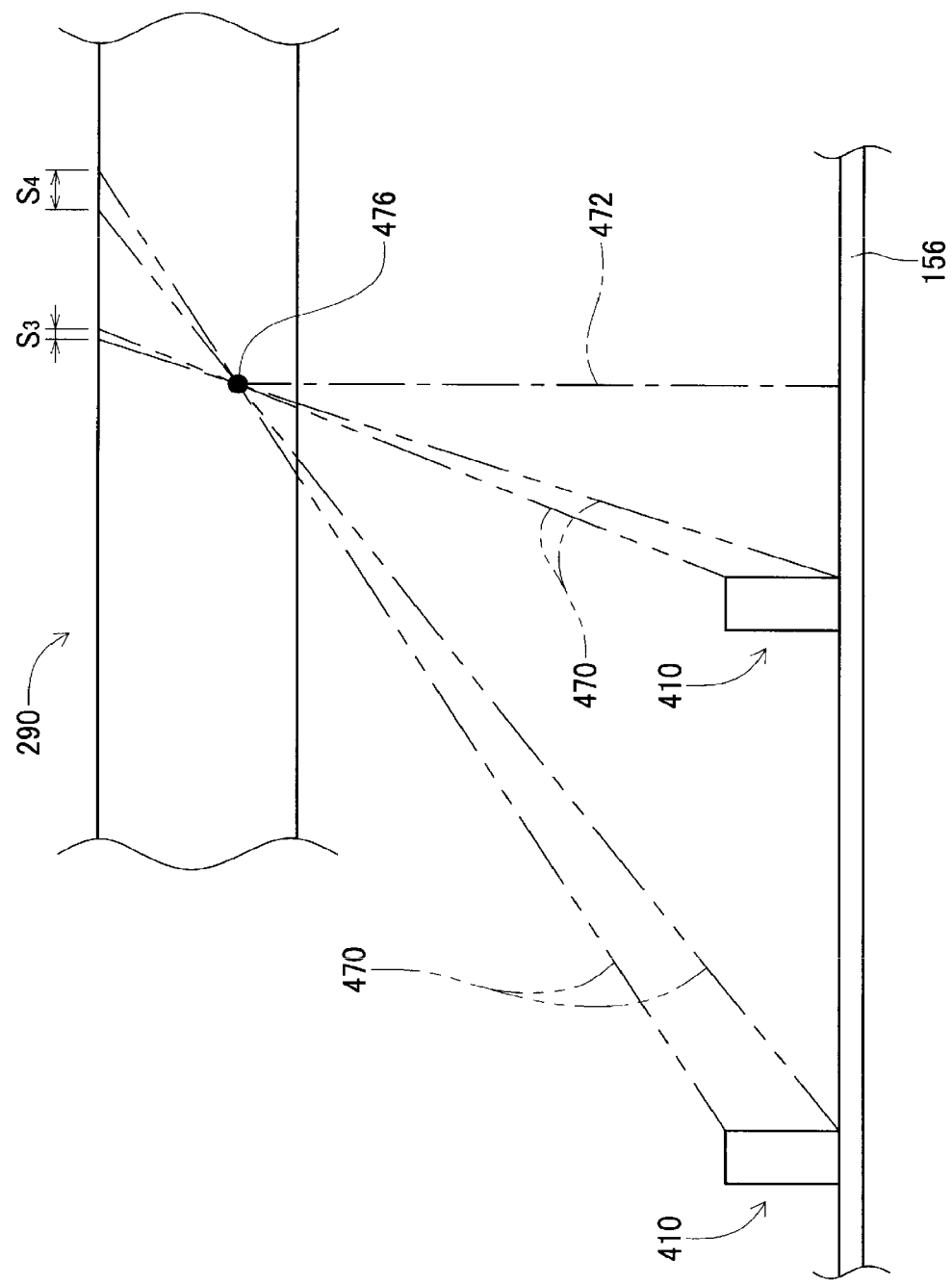
FIG. 20 shows a state of imaging of a leaded component captured by a camera with a viewing angle greater than 0 degrees.

Also, with loose component supply device 32, the estimated side surface length is set based on the parallax that arises between the deviation in the light axis of camera 290 and the main light beam. Specifically, as shown in FIG. 20, the further the distance from light axis 472, the larger the angle of main light beam 470. Therefore, with an image formed by reflection from the side surface of leaded component 410 of main light beam 470 that enters camera 290, the further the position of leaded component 410 away from light axis 472, the larger the image of the side surface of the leaded component 410. In the figure, the image dimension of the side surface of the leaded component 410 positioned further from light axis 472 (S4) is larger than the image dimension of the side surface of the leaded component 410 positioned closer to light axis 472 (S3). In other words, it is necessary to change the estimated side surface length in accordance with the position on stage 156 of the leaded component 410 that is the imaging target.

Figure 21:
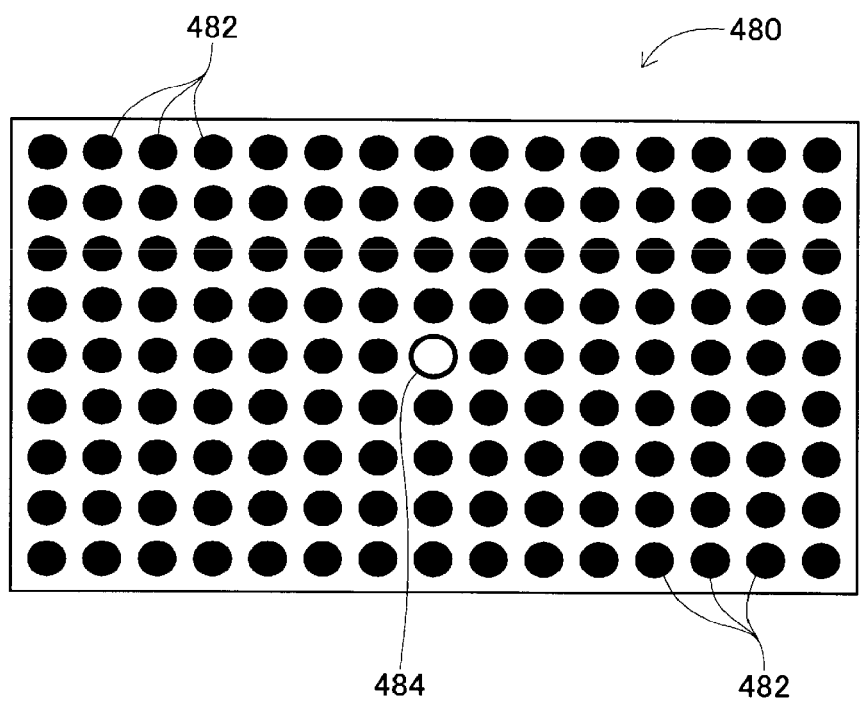
FIG. 21 is a plan view of a plate.

Considering this, the position deviation arising during due to the parallax is calculated using measurement plate 480 shown in FIG. 21. Specifically, multiple black circles 482 are arranged in a grid of N columns and M rows on plate 480. Also, the central position only of plate 480 is indicated by white circle 484. Then, before starting component supply using loose component supply device 32, as preparation, plate 480 is arranged on stage 156 such that white circle 484 matches light axis 472 of camera 290, and plate 480 is imaged by camera 290. Next, plate 480 is imaged by camera 290 at a position 10 mm raised above the upper surface of stage 156. Then, plate 480 is imaged by camera 290 at a position 20 mm raised above the upper surface of stage 156. Then, plate 480 is imaged by camera 290 at a position 30 mm raised above the upper surface of stage 156.

Figure 22:
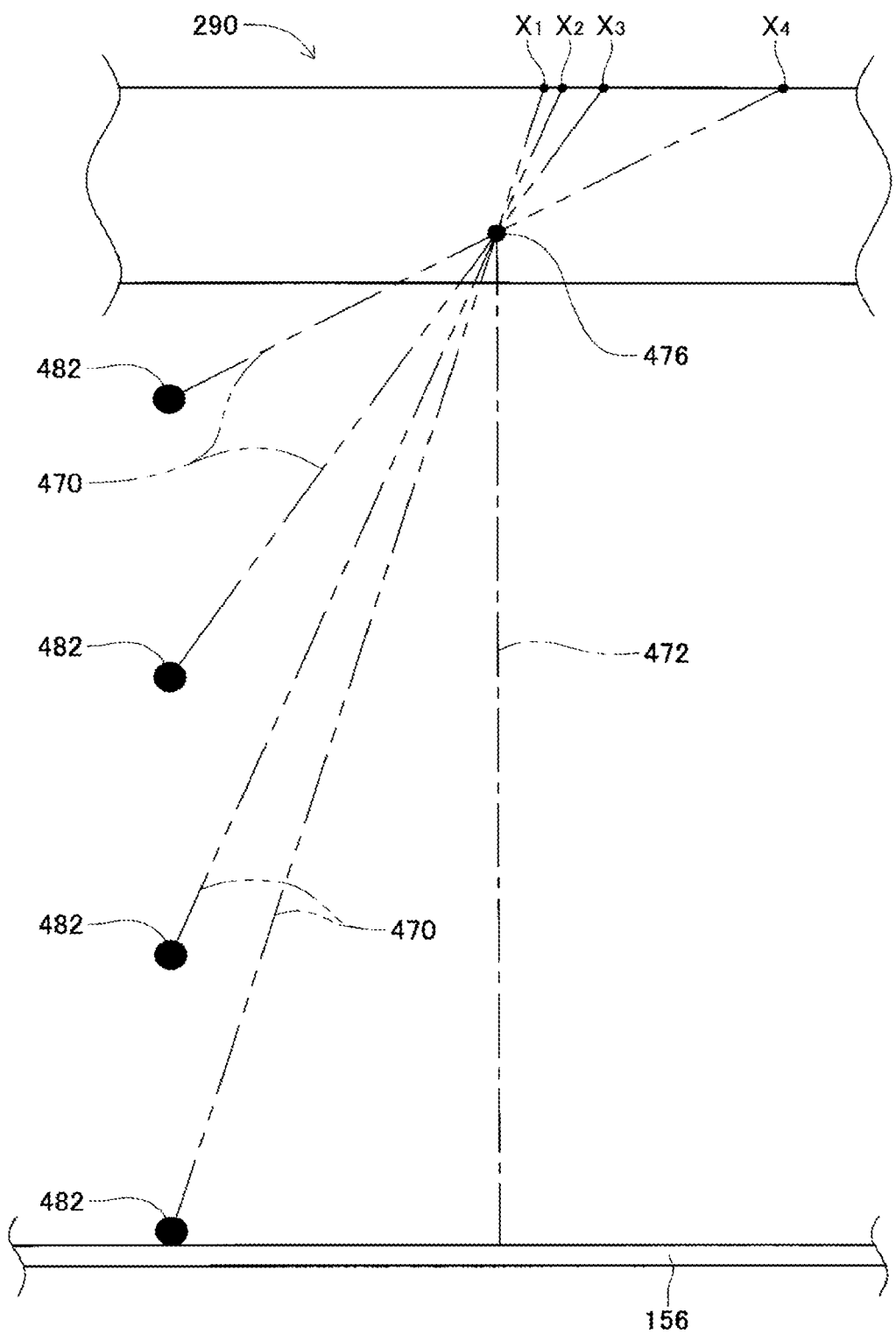
FIG. 22 shows a state of imaging of a plate as the target object captured by a camera with a viewing angle greater than 0 degrees.

By moving the imaging position up by 10 mm increments in the vertical direction and imaging multiple times using camera 290, as shown in FIG. 22, it is possible to calculate the position deviation of the imaging position of black circles 482. In detail, the position of a specified black circle 482 from imaging of plate 480 loaded on the upper surface of stage 156 is calculated as X1, and the position of the specified black circle 482 from imaging of plate 480 10 mm above the upper surface of stage 156 is calculated as X2. Further, the position of the specified black circle 482 from imaging of plate 480 20 mm above the upper surface of stage 156 is calculated as X3, and the position of the specified black circle 482 from imaging of plate 480 30 mm above the upper surface of stage 156 is calculated as X4. The positional deviation of the black circle 482 arises due to the influence of the parallax due to the deviation between light axis 472 of camera 490 and main light beam 470.

Also, the relationship between the positional deviation of black circles 482 and the height of the imaging position of plate 480 is calculated, and the estimated side surface length is calculated based on the thickness of leaded component 410, that is, the height of the side surface of the leaded component 410 scattered on stage 156 in the first orientation or the second orientation. Specifically, in a case in which L is the position deviation amount of black circle 482, and H is the imaging position height of plate 480, the relationship between the position deviation of black circle 482 and the height of the imaging position of plate 480 is represented by the following formula.

$$L = f(H)$$

Further, if the side surface height of leaded component 410 is h, the estimated side surface height is calculated as $f(h)$. Note that, as shown in FIG. 21, black circles 482 are arranged in a grid of N columns x M rows, and an estimated side surface height is calculated for each of the multiple black circles 482. Thus, it is possible to calculate an appropriate estimated side surface height for each position of leaded component 410 scattered on stage 156. Then, using the estimated side surface height calculated in this manner, in accordance with the method described above, determination of pickup target components is performed. Accordingly, by calibrating the estimated side surface height appropriately and using the calibrated estimated side surface height to determine the pickup target component, it is possible to guarantee appropriate pickup. The estimated side surface height may be a specific value or a value representing a specified range.

Also, upon setting the pickup target component using the above method, the set pickup target component is held by chuck 332. When holding the pickup target component using chuck 332, chuck 332 is positioned in the non-pivoted position. Then, after holding leaded component 410 using chuck 332, component holding head 302 is moved above component carrier 388. Then, component carrier 388 is moved to the component receiving position by operation of component carrier moving device 390. Also, when component holding head 302 is moved above component carrier 388, chuck 332 is pivoted to the pivoted position. Note that, chuck 332 is rotated by operation of rotating device 335 such that leads 414 of the leaded component 410 held by chuck 332 that is in the pivoted position face downwards in a vertical direction.

When component holding head 302 is moved above component carrier 388, leaded component 410 in a state with leads 414 facing downwards in the vertical direction is inserted into component reception recess 416 of component reception member 392. By this, as shown in FIG. 11, leaded component 410 is loaded in component receiving member 392 with leads 414 facing vertically downwards.

Also, when leaded component 410 is loaded on component receiving members 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the upper surface that is opposite to the bottom surface to which leads 414 are connected facing upwards. Therefore, suction nozzle 66 of work head 60 or 62 is able to appropriately hold leaded component 410.

(b) Collection and Replenishment of Leaded Components

With loose component supply device 32, when it is determined that pickup target components are present on stage 156 of component support member 150 using pattern matching and the side surfaces of imaged leaded components 410, pickup of the pickup target components is repeated and the picked up pickup target components are loaded on component receiving member 392. Then, by component carrier 388 mounted on component receiving member 392 being moved to the component supply position, supply of leaded components 410 is performed. However, based on the pickup target component determination, if it is determined that pickup target components are not present on stage 156, that is, all leaded components 410 that can be picked up have been picked up and only leaded components 410 that cannot be picked up are present on stage 156, the leaded components 410 remaining on stage 156 are collected in component collection container 18. Then, leaded components 410 collected into component collection container 18 are scattered again onto stage 156, and by doing so the orientation of the leaded components 410 changes such that pickup of leaded components 410 from stage 156 can be restarted.

Specifically, component support member 150 on which leaded components 410 that cannot be picked up are scattered is moved below component supply apparatus 88. That is, component support member 150 is moved from the exposed state (refer to FIG. 5) towards the stored state (refer to FIG. 6). Here, component collection container 180 provided at the front end of component support member 150 is oriented such that the opening is facing up, that is, component support member 150 is in the collection orientation. Therefore, leaded components 410 on stage 156 of component support member 150 are stopped by the front end of inclined plate 128 of component supply apparatus 88 in accordance with the movement of component support member 150. Further, as shown in FIG. 6, when component support member 150 reaches the stored state, leaded components 410 on stage 156 fall inside component collection container 180. By this, leaded components 410 remaining on stage 156 are collected in component collection container 180.

Continuing, when leaded components 410 are collected in component collection container 180, those leaded components 410 are scattered onto stage 156. In detail, when collection of leaded components 410 into component collection container 180 is complete, as shown in FIG. 6, component support member 150 is in the stored state. Also, component support member 150 is moved from the stored state towards the front by the operation of component support member moving device 152. Next, when component support member 150 has been moved forward from the stored state by a specified amount, container swinging device 181 of component returning device 92 is operated and component collection container 180 is swung. Note that, movement of component support member 150 does not stop even when component collection container 180 swings. That is, component collection apparatus 180 swings while component support member 150 is moving.

Here, the orientation of component collection container 180 changes from an orientation with the opening facing up (collection orientation) to an orientation with the opening facing stage 156 (returning orientation) by the swinging of component collection container 180. By this, leaded components 410 collected in component collection container 180 are scattered onto stage 156. Note that, as described above, when component collection container 180 is swung, component support member 150 also moves, and when reaching the exposed state, movement of component support member 150 is stopped. Thus, by scattering leaded components 410 on stage 156 from component collection container 180, the orientation of the leaded components 410 is changed, and leaded components 410 are picked up again from stage 156. Also, after leaded components 410 have been scattered on stage 156 from component collection container 180, the orientation of component collection container 180 returns from the orientation with the opening facing stage 156 (returning orientation) to the orientation with the opening facing up (collection orientation).

Note that, if there are few leaded components 410 scattered on stage 156 from component collection container 180, leaded components 410 are replenished on stage 156 from both component collection container 180 and component supply apparatus 88. In detail, when component support member 150 is moved below component supply apparatus 88, leaded components 410 are discharged onto stage 156 of component support member 150 from component supply apparatus 88. Note that, because the discharge of leaded components 410 from component supply apparatus 88 is performed in the same manner to the procedure described above, descriptions are omitted here.

After the discharging of leaded components 410 from component supply apparatus 88, on stage 156 there are leaded components 410 that remained on stage 156 from before the discharging of leaded components 410 from component supply apparatus 88 and there are leaded components 410 newly discharged from component supply apparatus 88. Thus, leaded components 410 discharged from component supply apparatus 88 when component support member 150 was moving towards the stored state and leaded components 410 remaining on stage 156 from before the leaded components 410 were discharged from component supply apparatus 88 are collected in component collection container 180. Then, as described above, component support member 150 is moved from the stored state to a moved state, and here component collection container 180 is swung. By this, the leaded components 410 remaining on stage 156 as components that could not be picked up and leaded components 410 discharged from component supply apparatus 88 are scattered on stage 156. By this, a large quantity of leaded components 410 is scattered on stage 156.

Note that, as shown in FIG. 12, individual control device 452 of loose component supply device 32 includes first calculating section 500, first determining section 502, creation section 504, second calculating section 506, third calculating section 508, second determining section 510, and control section 512. First calculating section 500 is a functional section for calculating calculated side surface length L based on image data of leaded component 410. First determining section 502 is a functional section for determining whether the calculated side surface length L matches an estimated side surface length. Creation section 504 is a functional section for creating image data based on the multiple images obtained by imaging plate 480 multiple times at different heights. Second calculating section 506 is a functional section for calculating an estimated side surface height based on a position deviation of black circle 482. Third calculating section 508 is a functional section for calculating an upper surface shape of leaded component 410, that is, outer edge lines of leaded component 410, using pattern matching based on image data of leaded component 410. Second determining section 510 is a functional section for determining whether the calculated outer edge lines of leaded component 410 match the outer edge lines of leaded component 410 based on the image data memorized in memory device 456. Control section 512 is a functional section for holding a pickup target component using chuck 332 in a case in which a match is determined by first determining section 502 and second determining section 510.

Note that, loose component supply device 32 is an example of a component supply system. Imaging device 84 is an example of an imaging device. Stage 156 is an example of a stage. Chuck 332 is an example of a holding tool. Individual control device 452 is an example of a control device. Black circle 482 is an example of a target object. First calculating section 500 is an example of a first calculating section. First determining section 502 is an example of a first determining section. Creation section 504 is an example of a creation section. Second calculating section 506 is an example of a second calculating section. Third calculating section 508 is an example of a third calculating section. Second determining section 510 is an example of a second determining section. Control section 512 is an example of a control section. Calculation side surface length L is an example of an index value. The estimated side surface length is an example of a set value.

Further, the present disclosure is not limited to the above example embodiments, and various changed or improved methods of embodiment are possible based on the knowledge of someone skilled in the art. Specifically, for example, in an embodiment above, as an index value that specifies the size of a side surface of leaded component 410, the length of a side surface is used, but an area of an side surface, a shape of a side surface, or the like may be used.

Also, in an embodiment above, an estimated side surface height is calculated by imaging plate 480, but estimated side surface heights may be calculated in advance based on a viewing angle of camera 290 or the like and those calculated estimated side surface heights may be memorized on memory device 456. Thus, the calculating load on individual control device 452 is reduced.

Also, in embodiments above, the present disclosure is applied to leaded components, but the present disclosure may be applied to various types of components. Specifically, for example, the present disclosure may be applied to configuration components of solar panels, configuration components of power modules, electronic components without leads, and so on. Also, as well as using chuck 332 as a holding tool for holding a component, various holding tools such as a suction nozzle may be used.

REFERENCE SIGNS LIST

32: loose component supply device (component supply system);
84: imaging device;
156: stage;
332: chuck (holding tool);
452: individual control device (control device);
482: black circle (target object);
500: first calculating section;
502: first determining section;
504: creation section;
506: second calculating section;
508: third calculating section;
510: second determining section;
512: control section

The invention claimed is:

1. A component supply system for a component mounter, configured to supply components on a stage in a scattered state, the component supply system comprising:
   a holding tool configured to hold the component scattered on the stage, the holding tool attached to a frame section;
   an imaging device configured to image a target component from above that is a holding target of the holding tool, the imaging device including a camera; and
   an individual control device, including:
      a first calculating section, configured to calculate an index value that specifies a size of a side surface of the target component based on an image data of the target component captured by the imaging device;
      a second calculating section, configured to calculate a set value based on a position deviation of the target object calculated from multiple image data captured by the imaging device;

a third calculating section, configured to calculate a shape of an upper surface of the target component based on the image data of the target component captured by the imaging device;

a first determining section configured to determine whether the index value calculated by the first calculating section matches a set value; and a control section configured to control movement of the holding tool such that the target component held by the holding tool when the first determining section determines that the index value matches the set value; and an overall control device connected to the holding tool, the imaging device, and the individual control device.

2. The component supply system according to claim 1, wherein the set value is calculated based on a parallax that arises due to a deviation in a main light beam at a position of the target component on the stage and a light axis of the imaging device.

3. The component supply system according to claim 1, wherein the individual control device further includes a creation section configured to create multiple imaging data in accordance with multiple images captured by the imaging device of a given target component at different heights, and the second calculating section is configured to calculate the set value based on a position deviation of the target component from the multiple image data created by the creation section.

4. A component supply system according to claim 1, wherein the individual control device further includes a second determining section configured to determine whether the shape of the upper surface of the target component calculated by the third calculating section matches a preset shape, and the control section is configured to control movement of the holding tool when the first determining section determines that the index value matches the set value and the second determining section determines that the shape of the upper surface of the target component matches the preset shape.

* * * * *